(12) United States Patent
Strehle et al.

(10) Patent No.: US 10,384,230 B2
(45) Date of Patent: Aug. 20, 2019

(54) METHOD FOR PRODUCING A SUBSTRATE STRUCTURED BY NANOWIRES, PRODUCED SUBSTRATE, AND USE OF THE SUBSTRATE

(71) Applicant: UNIVERSITÄT ULM, Ulm (DE)

(72) Inventors: Steffen Strehle, Ulm (DE); Daniel Markus Rosskopf, Ulm (DE); Andreas Magnus Probst, Westerheim (DE)

(73) Assignee: UNIVERSITÄT ULM, Ulm (DE)

(*) Notice: Subject to any disclaimer, the term of this patent is extended or adjusted under 35 U.S.C. 154(b) by 0 days.

(21) Appl. No.: 15/537,545

(22) PCT Filed: Dec. 14, 2015

(86) PCT No.: PCT/EP2015/079605
§ 371 (c)(1),
(2) Date: Jun. 19, 2017

(87) PCT Pub. No.: WO2016/096735
PCT Pub. Date: Jun. 23, 2016

(65) Prior Publication Data
US 2017/0348727 A1    Dec. 7, 2017

(30) Foreign Application Priority Data
Dec. 19, 2014  (DE) .................. 10 2014 226 649

(51) Int. Cl.
*B05D 1/28*    (2006.01)
*H05K 3/12*    (2006.01)
(Continued)

(52) U.S. Cl.
CPC ............ *B05D 1/28* (2013.01); *B81C 1/00373* (2013.01); *B82B 3/0066* (2013.01); *H05K 3/1275* (2013.01); *B81C 2201/0185* (2013.01); *B81C 2201/0187* (2013.01); *H05K 1/0306* (2013.01); *H05K 1/09* (2013.01); *H05K 3/102* (2013.01); *H05K 2201/026* (2013.01); *H05K 2201/09036* (2013.01); *H05K 2201/09045* (2013.01);
(Continued)

(58) Field of Classification Search
None
See application file for complete search history.

(56) References Cited

PUBLICATIONS

European Patent Office, International Search Report and Written Opinion issued in International Application No. PCT/EP2015/079605 (dated Mar. 9, 2016).
(Continued)

*Primary Examiner* — Jeffrey D Washville
(74) *Attorney, Agent, or Firm* — Leydig, Voit & Mayer, Ltd.

(57) ABSTRACT

The invention relates to a method for producing a substrate structured by nanowires, characterized in that no lubricant and no lithographic resist mask is used in the method, and only by moving a donor substrate having nanowires relative to a substrate and by locally tribological properties on the surface of the substrate, a specified number of nanowires is deposited selectively at locally defined points of the substrate. The invention further relates to a substrate that can be produced using the method according to the invention, and which selectively contains a specified number of nanowires on a surface at locally defined points. The invention further relates to the use of the substrate according to the invention in microelectronics, microsystems technology, and/or micro-sensor systems.

16 Claims, 8 Drawing Sheets

(51) Int. Cl.
  *B81C 1/00*   (2006.01)
  *H05K 1/03*   (2006.01)
  *H05K 1/09*   (2006.01)
  *B82B 3/00*   (2006.01)
  *H05K 3/10*   (2006.01)

(52) U.S. Cl.
  CPC ............ *H05K 2203/0108* (2013.01); *H05K 2203/0271* (2013.01); *H05K 2203/0528* (2013.01)

(56) References Cited

PUBLICATIONS

International Bureau of WIPO, International Preliminary Report on Patentability issued in International Application No. PCT/EP2015/079605 (dated Jun. 29, 2016).
Choi et al., "Field-emission properties of individual GaN nanowires grown by chemical vapor deposition", *Journal of Applied Physics*, 21: 4159-4165 (2011).
Fan et al., "Wafer-Scale Assembly of Highly Ordered Semiconductor Nanowire Arrays by Contact Printing", *Nano Letters*, 8(1): 20-25 (2008).
Javey et al., "Layer-by-Layer Assembly of Nanowires for Three-Dimensional, Multifunctional Electronics", *Nano Letters*, 7(3): 773-777 (2007).
Liu et al., "Transfer and Alignment of Random Single-Walled Carbon Nanotube Films by Contact Printing", *ACS Nano*, 4(2): 933-938 (2010).
Park et al., "Facile Fabrication of SWCNT/$SnO_2$ Nanowire Heterojunction Devices on Flexible Polyimide Substrate", *Advanced Functional Materials*, 21: 4159-4165 (2011).
Takahashi et al., "Monolayer Resist for Patterned Contact Printing of Aligned Nanowire Arrays", *Journal of the American Chemical Society*, 131(6): 2102-2103 (2009).
Yao et al., "A nanoscale combing technique for the large-scale assembly of highly aligned nanowires", *Nature Nanotechnology*, 8(5): 329-335 (2013).
Fan et al., "Large-scale, heterogeneous integration of nanowire arrays for image sensor circuitry," *PNAS* 105(32): 11066-11070 (2008).
European Patent Office, Notification under Article 94 (3) EPC in European Patent Application No. 15 817 137.1 (dated Apr. 8, 2019).

METHOD FOR PRODUCING A SUBSTRATE STRUCTURED BY NANOWIRES, PRODUCED SUBSTRATE, AND USE OF THE SUBSTRATE

CROSS-REFERENCE TO RELATED APPLICATIONS

This patent application is the U.S. national phase of International Application No. PCT/EP2015/079605, filed on Dec. 14, 2015, which claims the benefit of German Patent Application No. 102014226649.1, filed Dec. 19, 2014, the disclosures of which are incorporated herein by reference in their entireties for all purposes.

According to the invention, a method for the production of a substrate structured with nanowires is provided, which method is characterised in that, in the method, no lubricant and no lithographic resist mask is used and, merely by moving a donor substrate with nanowires relative to a substrate and locally different tribological properties on the surface of the substrate, a specific number of nanowires is deposited selectively at locally defined sites of the substrate. In addition, a substrate which is producible by the method according to the invention and comprises a specific number of nanowires on a surface selectively at locally defined sites is provided. Furthermore, the use of the substrate according to the invention in microelectronics, microsystem technology and/or microsensor technology is proposed.

The synthesis of nanowires (e.g. "bottom-up") opens up completely new perspectives for direct production of complex nanostructures. Growth of the individual nanowires on substrates is however effected generally three-dimensionally and distributed locally statistically. Substrates of microelectronics, microsystem technology and sensor technology would be able to profit from nanowires, however in general have planar geometries with a defined arrangement of functional structures. The difficulty resides hence in the fact that generally nanowires distributed statistically and three-dimensionally on the donor substrate have to be deposited in a defined geometry on substrates of microelectronics and sensor technology in a planar manner. In other words, a technology is required which makes it possible to transfer nanowires specifically and in a planar manner on a functional underlayer (future component, e.g. of microelectronics). Specific transfer hereby means control of the orientation, the deposition density and the positioning of the nanowires along the surface of the substrate (primarily in the two lateral directions, i.e. the length and width of the substrate).

The simplest method of transferring nanowires onto a target substrate is to break these from the original donor substrate and to transfer them directly, or dissolved, e.g. in ethanol. This method allows virtually no control over the lateral position or the orientation of the nanowires, i.e. the nanowires are deposited, distributed statistically on the target substrate. The functional integration (e.g. electrical contacts) must be consequently effected subsequently individually for each nanowire, which conflicts with parallel manufacture and an efficient method.

Methods were developed in the state of the art, such as e.g. manipulation or orientation of nanowires with electrical fields, surface acoustic waves (SAW) or defined liquid flows (e.g. Langmuir-Blodgett), in order to orientate the nanowires on the target substrate after deposition thereof. Although entirely good results were achieved locally, scalability, compatibility with modern micromanufacture, flexibility, reproducibility and lateral control, with respect to orientation and position of the nanowires, is possible with none of the known techniques. In particular when using SAW or electrical fields, the experimental input is very high and complex. Compatibility with microelectronics is hereby also in part greatly restricted. In addition, the known methods have in common that the nanowire deposition is effected from a liquid, which entails the disadvantage of damage or contamination effects.

So-called "contact printing" is known in the state of the art. The donor substrate with the nanowires is hereby in mechanical contact with the functional substrate. By relative movement of the two underlayers relative to each other, the nanowires are detached and orientated in the direction of movement. Control of the local nanowire deposition has however to date been achieved hereby only in combination with a photoresist process, i.e. before the printing, photoresist is applied on the functional underlayer (i.e. the target substrate) and subsequently structured microtechnologically. In the subsequent contact printing, nanowires are deposited both on the photoresist-covered and the photoresist-free regions of the target substrate. If the photoresist is subsequently removed, then the nanowires which were deposited on the photoresist are removed with it. Hence, only the nanowires which were deposited in the photoresist-free regions of the target substrate ("lift-off process") remain on the target substrate. It is known, in this method, that the deposition density of the nanowires on the target substrate is influenced by the contact pressure, the chemical functionalisation of the surface and by the presence of a lubricant (e.g. silicone oil). In particular, a chemical surface functionalisation can in fact lead to a higher deposition density of the nanowires, but has the disadvantage that it is not long-term stable (particularly under the effect of lubricant), and lubricants, but also surface functionalisations, can be used only in a very restricted manner for modern micromanufacture. In tests without lubricant, no detectable effect of surface functionalisations on the density of nanowires was found.

Furthermore, it is known in the state of the art that the principle of the resist-based contact printing of nanowires can be further miniaturised and optimised, if the openings of the resist mask, in the direction of movement, are smaller than the length of the nanowires. The modification of the method is termed "nanocombing", since the absolute orientation with respect to the angle could hereby be improved by approx. one order of magnitude. In the case of "nanocombing", a nanowire to be deposited always contacts the functional underlayer ("anchor point") and the photoresist. If the resist is removed as in the "lift-off process", only "anchored" nanowires remain. If the opening in the direction of movement is however significantly shorter than the wire length, then the nanowire spans the resist opening and "nanocombing" is no longer possible.

In the case of the known "nanocombing", the contact printing is implemented with lubricants, generally with mineral oil, which must be removed again after printing by means of a suitable solvent (e.g. octane). Furthermore, removal of the resist layer represents here a particular requirement since the nanowires, despite the so-called "anchor points", are still connected to the resist. If the photoresist is removed wet-chemically, then also the anchored nanowires can be jointly removed, which negatively impairs the deposition efficiency. In addition, removal of the resist layer with acetone vapour is known, which in fact is less aggressive but very complex. Furthermore, it is problematic of the "nanocombing" process or also of the previous contact printing process that in particular the resist mask and, in part, also the target substrate can be damaged even in the presence of a lubricant by abrasive effects during the contact pressures required for the nanowire deposition. This disadvantage restricts the scalability, the compatibility with micromanufacturing techniques and also intrinsically the minimum web width for lithographic resist structures, e.g. during "nanocombing", which can still withstand the mechanical effects.

Starting herefrom, it was the object of the present invention to provide a method for contact printing of nanowires on a substrate, on which, without the requirement for a resist mask or removal thereof, without use of lubricants and/or without a chemical functionalisation of the surface thereof, a site-specific and efficient deposition of nanowires on a substrate is possible with a contact printing process.

The object is achieved by the method for the production of the substrate, and the use thereof described herein. Advantageous embodiments are also described.

According to the invention, a method for the production of a substrate structured with nanowires is provided, comprising the steps:
  a) Providing a substrate which, on one surface, comprises at least one first region with first tribological properties and at least one second region with second tribological properties, the first and second tribological properties being different and the first region contacting the second region at least in regions;
  b) Pressing a donor substrate comprising nanowires with a specific contact pressure on the first region of the substrate so that the nanowires contact the first region of the substrate at least in regions; and
  c) Moving the donor substrate relative to the substrate in the direction from the first region over at least the second region at a specific speed;
characterised in that, in the method, no lubricant and no lithographical resist mask is used and, merely by moving the donor substrate, in step c), and the different tribological properties of the two regions, a specific number of nanowires is deposited selectively at locally defined sites of the first and/or second region.

In particular, the use of no lubricant and no lithographical resist mask means that no lubricant and no lithographical resist mask is applied on the substrate and/or is removed from the substrate during the method.

An essential advantage of the production method according to the invention is that a substrate structured with nanowires can be provided, wherein, compared with substrates from the state of the art (e.g. substrates in the "nanocombing" method), specifically local tribological differences on the substrates are used in order to deposit nanowires locally without the use of lubricants and without lithographical resist masks and without requiring to remove a lithographical resist as mask—in contrast to the "lift-off" technique.

Furthermore, the precision of the method is not determined by a resist stability and no complex methods for resist removal, which can damage or change the nanowire arrangement on the substrate, are required. The method is entirely compatible with conventional micromanufacture and, relative to the state of the art, has no contamination due to lubricants or chemical (e.g. chemical covalent) surface modifications. Furthermore, it is also significantly more flexible with respect to the material choice, the material combinations and also the functional configuration (e.g. local topography).

Consequently, the method is also suitable for substrates which are sensitive to lubricants and/or lithographical resists. In addition, deposition of individual nanowires in very narrow regions is possible with significantly higher local resolution or also with small spacings than in the "nanocombing" method. Such a selective and fine deposition of nanowires on a substrate is not possible with the resist masks used in the state of the art since the mechanical stability of the resist webs prevents this fineness or the required narrow and short resist openings leads to an increasing adhesion of the nanowires on the resist and hence to the removal thereof (hence no deposition on the substrate) during the required resist removal from the substrate.

During the method, the nanowires interact over a specific length and width (i.e. area) of the individual nanowires with the first and/or second region. Since the first and second region have different tribological properties, a different high friction force for the nanowires is produced over both regions and, upon reaching a critical level, leads to detachment or deposition of a nanowire on the first or second region of the substrate. The interactive surface changes continuously due to the movement of the nanowires relative to the surface and can therefore be influenced locally by changing the material, the topography (e.g. local height and/or shape) and/or the coefficient of friction of the surface (first and/or second region). The application spectrum of the method according to the invention extends from nanowire surface depositions as far as positioning of an individual nanowire. Furthermore, the presented contact printing process is successful without resist masks for local delimitation of the deposition and also without lubricants during the contact printing.

Movement of the donor substrate with the nanowires relative to the substrate can be effected, in principle, in any spatial direction (along the length, along the width and/or perpendicular to the surface of the substrate), individually and also non-linearly, which leads to individual movement patterns and can effect non-linear deposition of nanowires. The movement can be produced manually or with the help of a drive technique, possibly assisted in addition by a control technique. The contact pressure of the friction partners can be effected statically or dynamically and, in principle, can be coupled with the control- and drive system.

The presented method uses at least one of the following conditions for selective and site-specific deposition of nanowires on a substrate:
  1. The tribological interaction between nanowires and substrate during the movement influences the deposition probability of a nanowire during contact printing, local variations in the tribological interaction being exploited for local deposition of nanowires;
  2. Different materials have a different tribological interaction with a specific nanowire;
  3. In the case of the same contact printing parameters, such as pressure and speed, the deposited nanowire density is locally different, if also the local tribological interactions are different;
  4. The density of nanowires on the donor substrate and the relative speed can influence the deposition rate of nanowires (tribological correlation);
  5. A local topography change on the substrate leads to a local change in the tribological interaction between nanowires and substrate;
  6. By means of a locally predefined use of topographical structures, the site of the deposition of nanowires can be controlled specifically (collector structures), as a result of which the nanowires can also be deposited on the substrate specifically in a geometry which deviates from linearity (e.g. curved);

7. Grooves can be provided in the substrate which can be spanned by the nanowires or in which nanowires are deposited.

The method according to the invention can be characterised in that the different tribological properties of the first and second region are achieved via at least one collector structure which the first and/or second region comprises or consists of, or which is applied optionally on the latter.

The at least one collector structure can
a) in the first region, comprise a material or consist thereof, which is identical to or different from a material of the second region;
b) in the second region, comprise a material or consist thereof, which is identical to or different from a material of the first region;
c) in the first region, comprise a topographical structure or consist thereof, which is identical to or different from the topographical structure of the second region; and/or
d) in the second region, comprise a topographical structure or consist thereof, which is identical to or different from the topographical structure of the first region.

The at least one collector structure can comprise a metal, a metal compound, a semimetal, a semimetal compound, a plastic material and/or carbon, in particular gold, Pt, Al, Si, Ge, $SiO_2$, $Si_3N_4$, diamond, $Al_2O_3$ and/or TiN, or consist thereof. If the collector structure in the second region consists for example of $Si_3N_4$, and the first region consists of gold, then, in the case of specific nanowires (e.g. nanowires made of silicon), specific contact pressure, specific geometry of the collector structure and specific speed of movement of the nanowires, the deposition is effected only in the $Si_3N_4$ region. The material dependency is determined e.g. by the different adhesion- and also cohesion forces between the friction partners which are used. Consequently, by choice of different materials and also the different topographical structure thereof (e.g. height), the deposition density of nanowires on the substrate can be predetermined. If the contact printing efficiency on the materials $SiO_2$, gold and $Si_3N_4$ is compared, then it is shown that, for nanowires made of silicon at a specific, equal contact pressure on $Si_3N_4$, a high deposition, on gold a lower deposition and on $SiO_2$ practically no deposition of nanowires is achieved. For $SiO_2$, only at a significantly increased contact pressure (e.g. higher by the factor 3), is nanowire stripping achieved, which is accompanied however by highly abrasive surface damage.

In a preferred embodiment, the topographical structure is selected from the group consisting of planar, linear and/or point-type topographical structures. Preferably, the topographical structure comprises a triangular shape, a cuboid shape, a cylindrical shape, a spherical shape, a semi-spherical shape, a raised portion and/or a depression or consists thereof.

The simplest topographical difference hereby is represented by a step in the second region as a height difference in the direction of movement, e.g. with a height of the order of magnitude of the diameter of the nanowires. The step can be positive or negative, i.e. can be raised or lowered relative to the first and/or second region. If the step in the second region is manufactured from the same material as the material of the first region (first material=second material), then a homostructure is present which dominates the contact printing mainly geometrically. The second region can also have a surface roughness which is different from the first region, which effects a different coefficient of friction.

If the step in the second region is manufactured from a different material from the material of the first region (first material≠second material), a heterostructure is present and in addition material effects can be used (e.g. different material-specific coefficients of friction). For example, at least two different material surfaces on the substrate can abut against each other in a planar manner (height difference between the material surfaces is e.g. 10 nm). The different materials have the effect that, in the first and second region, stripping of the nanowires is effected at different densities.

The at least one collector structure can have a length, width and/or height, preferably a height, of 1 nm to 1 mm (optionally 10 nm to 100 µm, 50 nm to 10 µm or 100 nm to 1 µm). The first region of the substrate used in the method can therefore have a height which is different from the second region. If both regions are made from the same material, then a height difference or an altered surface topography is advantageous for effecting different deposition densities in the first and second region.

In a preferred embodiment, at least one collector structure comprises nanoparticles (e.g. essentially round nanoparticles or nanoparticles in semi-spherical form) or consists thereof. These can be applied at least in regions, e.g. in step a) of the method, on the first and/or second region or these can be (already) applied. The nanoparticles can have a diameter of 2 nm to 200 nm, preferably 20 to 100 nm (measured by electron microscopy).

In a further preferred embodiment, at least two (optionally at least 3, 4, 5, 6, 7, 8, 9 or 10) collector structures are contained in the first and/or second region or the latter consists thereof, or they are applied on the latter, preferably respectively two collector structures having a spacing relative to each other, which spacing corresponds essentially to the diameter and/or the length of a nanowire of the donor substrate.

The nanowires can be deposited on the substrate in a geometry which deviates from linearity, preferably in a curved geometry. Deposition in a geometry which deviates from linearity can be achieved by
i) Movement of the donor substrate relative to the substrate in different directions relative to the first region and/or second region at a specific speed; and/or
ii) Movement of the donor substrate over at least one collector structure (optionally at least 2, 3, 4, 5, 6, 7, 8, 9 or 10 collector structures) which the first and/or second region comprises or consists of, or which is applied optionally on the latter.

The presented contact printing process can hence also be effected sequentially by varying the angle (variation in the direction of movement in the direction of the length of the substrate, width of the substrate and/or perpendicular to the surface of the substrate), as a result of which intersected nanowire arrangements can be generated. Preferably, the relative movement of direction is therefore changed in the method according to the invention in step c) and/or step c) is repeated at least once. Also more than one collector structure on the substrate enables defined local deposition of nanowires. With suitable choice of the predefined spacing between e.g. two opposite collector structures, in addition the length or width (diameter) of locally deposited nanowires can be influenced. In the case of a spacing in the range of the diameter of the nanowires, an individual nanowire on the substrate can be deposited specifically on the substrate according to the invention and at a locally defined site. Preferably, the at least one nanowire of the substrate is deposited at least in regions between at least two opposite collector structures.

In step a), the first and/or second region of the substrate can be produced via a micromanufacture technique, preferably via photolithography, electron beam lithography, "lift-off" technique, PVD, CVD and ALD and/or dry- and wet-chemical etching.

In the first region and/or second region or between both regions, at least one groove can be produced or disposed, the groove being preferably spanned by at least one nanowire at least in regions and/or at least one nanowire being deposited in the groove at least in regions, in particular the length of the at least one groove being preferably less than half the length of the nanowires.

The nanowires can
i) comprise a metal, metal compounds, semimetal, semi-metal compounds, carbon and/or carbon compounds or consist thereof, preferably silicon, ZnO and/or carbon nanotubes; and/or
ii) be produced, before step b), via a vacuum process, preferably a gold-catalysed "vapour-liquid-solid" process, or via a dry- or wet-chemical process; and/or
iii) have a length of 100 nm to 1 mm, preferably 1 µm to 500 µm, particularly preferably 5 µm to 200 µm, in particular 10 µm to 100 µm; and/or
iv) have a diameter of 1 nm to 5 µm, preferably 2 nm to 500 nm, particularly preferably 5 nm to 200 nm, in particular 10 nm to 100 nm; and/or
v) have a conical, cylindrical, curved and/or square structure at least in regions; and/or
vi) be metallically conducting, p-conducting, n-conducting, intrinsically conducting and/or non-conducting at least in regions or completely.

The contact pressure can be e.g. in a range of 5 kPa to 100 kPa, preferably 8 kPa to 80 kPa, particularly preferably 10 kPa to 60 kPa, in particular 12 kPa to 50 kPa. A higher contact pressure also implies an increase in the surface interaction of nanowires and substrate during the process, which results in a higher deposition probability.

Tests with respect to surface roughness on materials used by way of example, $Si_3N_4$ and SiO, show that $SiO_2$ was hereby significantly rougher at approx. 12 nm (RMS) than $Si_3N_4$ with approx. 2 nm (RMS). Greater roughness would basically only reduce the absolute contact area (Bowden-Tabor model) and hence presents a reason, in addition to pure material effects, for the different behaviour of the various materials.

In the process, the speed of movement over the substrate can be, e.g. 1 to 20 mm/s, preferably 2 to 15 mm/s, particularly preferably 3 to 10 mm/s, in particular 4 to 8 mm/s. During the process, it can occur that the original substrate is depleted in nanowires. The continuous loss of nanowires intrinsically produces a gradient in the deposited nanowire density with increasing distance from the starting point of the process. This can possibly be an advantage if a lower deposition density of nanowires is desired with increasing distance. By control of the parameters, contact pressure and speed, this effect can intrinsically be compensated for.

Furthermore, a substrate is provided according to the invention, comprising on one surface
a) at least one first region with first tribological properties;
b) at least one second region with second tribological properties, the second region contacting the first region at least in regions;
c) at least one nanowire which contacts the first and/or second region at least in regions;
characterised in that the first and second region have different tribological properties and the first and/or second region comprises a specific number of nanowires selectively at locally defined sites, the substrate according to the invention being producible (or being produced) via the method according to the invention.

The substrate can comprise at least one groove which is disposed between the first and second region or in the first region and/or in the second region, preferably contacts the first and/or second region. At least one nanowire can span the groove.

The substrate can comprise at least one nanowire which preferably contacts the first and/or second region and is disposed particularly preferably between the at least two, preferably between a plurality of, opposite collector structures. The at least one nanowire can have a geometry which deviates from linearity, preferably be curved at least in regions.

The substrate according to the invention can have at least one feature which was mentioned above for the substrate and the components thereof in the context of the method according to the invention.

Furthermore, the use of the substrate according to the invention is proposed in analysis, material synthesis, microelectronics, microsystem technology and/or microsensor technology.

BRIEF DESCRIPTION OF THE DRAWINGS

The subject according to the invention is intended to be explained in more detail with reference to the subsequent Figures and examples without restricting said subject to the specific embodiments illustrated here.

FIGS. 1 $a$) and $b$) show the influence of a step with a height of approx. 80 nm for $Si_3N_4$. Steps produce a locally greater tribological interaction and hence a locally higher density of deposited nanowires on the raised surfaces. This is irrespective of the direction of movement.

FIG. 3$a$) shows that, in the case of a first and second region made of $SiO_2$ and a step height of approx. 80 nm, no great change in the deposition rate occurs. FIG. 3$b$) shows a significant difference in the deposition rate in the case where in fact a lower height step, compared with FIG. 3$a$), prevails between the regions (50 nm instead of 80 nm), but the first and second region are made of a different material (first region $Si_3N_4$, second region gold).

FIG. 4$a$) shows the deposition of nanowires on a substrate, the first region of which consists of $SiO_2$ and the second region of which has square structures made of gold. It is observed that the nanowires are deposited directly behind the square gold structure (gold structure has a height and hence step of 50 nm). In FIG. 4$b$), the drastically increased local deposition of nanowires on a substrate is illustrated, the first region of which consists of $Si_3N_4$ and the second region of which consists of round gold structures (gold nanoparticles). FIG. 4$c$) shows an REM picture of the surface in the region of the gold nanoparticles. It becomes clear that the nanowires are deposited entirely on the $Si_3N_4$ and between the gold nanostructures. Also the deviation from linearity during deposition becomes clear here in fact.

FIG. 5$a$) shows the specific local deposition of conical nanowires between the gold structures (structure in "+" form) on $Si_3N_4$. In FIG. 5$b$), the deposition of a nanowire on a step made of $SiO_2$ (second region) on $Si_3N_4$ (first region) is shown in contrast (step height approx. 450 nm). The groove exists as a result of manufacture. Consequently, it becomes clear that the tribological properties of the material SiO$_2$ which has low affinity with the nanowires used, can lead, by insertion of a topographical structure made of this material with a suitable height, to successful deposition of nanowires. Hence, "low affinity regions" can also become carriers of nanowires by raising the level thereof relative to adjacent regions.

FIG. 8 shows a nanocrystalline diamond layer, in which steps with 1 μm height were produced. In the case of contact printing with Si nanowires, it was shown that, with this material, deposition is effected preferably on lower-lying surfaces. The use of the different tribological properties of first and second regions on one substrate is therefore universally possible and not limited to specific substrates.

DETAILED DESCRIPTION OF THE INVENTION

Example 1—Height Difference and Identical Material of the Regions

Figure 1:
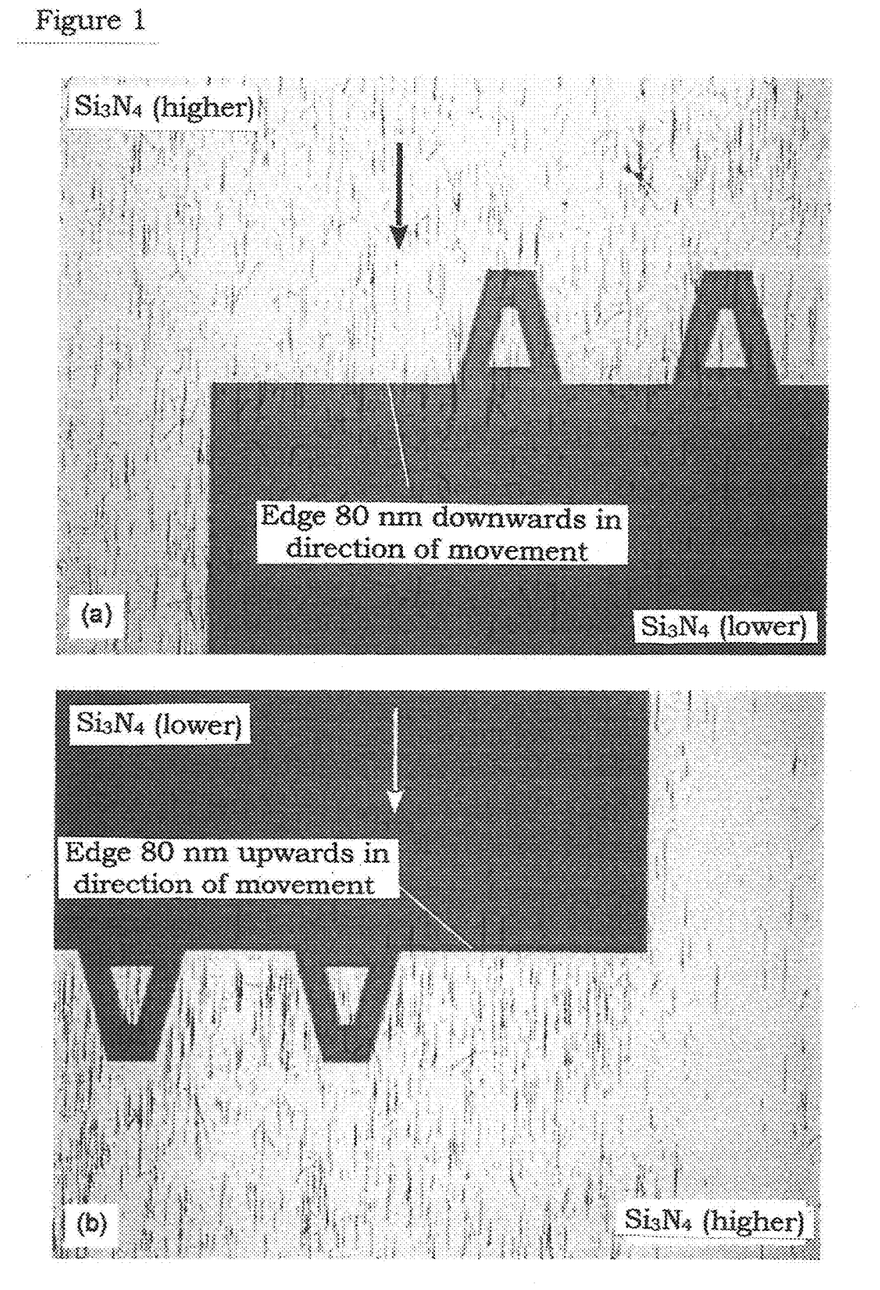

FIGS. 1a and 1b show, by way of example, the Si$_3$N$_4$ system, in which either the first region (FIG. 1b) or the second region (FIG. 1a) made of Si$_3$N$_4$ was moved 80 nm downwards. It can hereby be detected clearly that, for this case, a clearly higher nanowire density was deposited on all raised surfaces.

The direction of movement is characterised respectively in the illustration by an arrow. Whilst in the case of Si$_3$N$_4$ a very large influence on the topography is present, this is not to be expected in the case of planar structures made of SiO$_2$ and also could not be detected.

Figure 3:
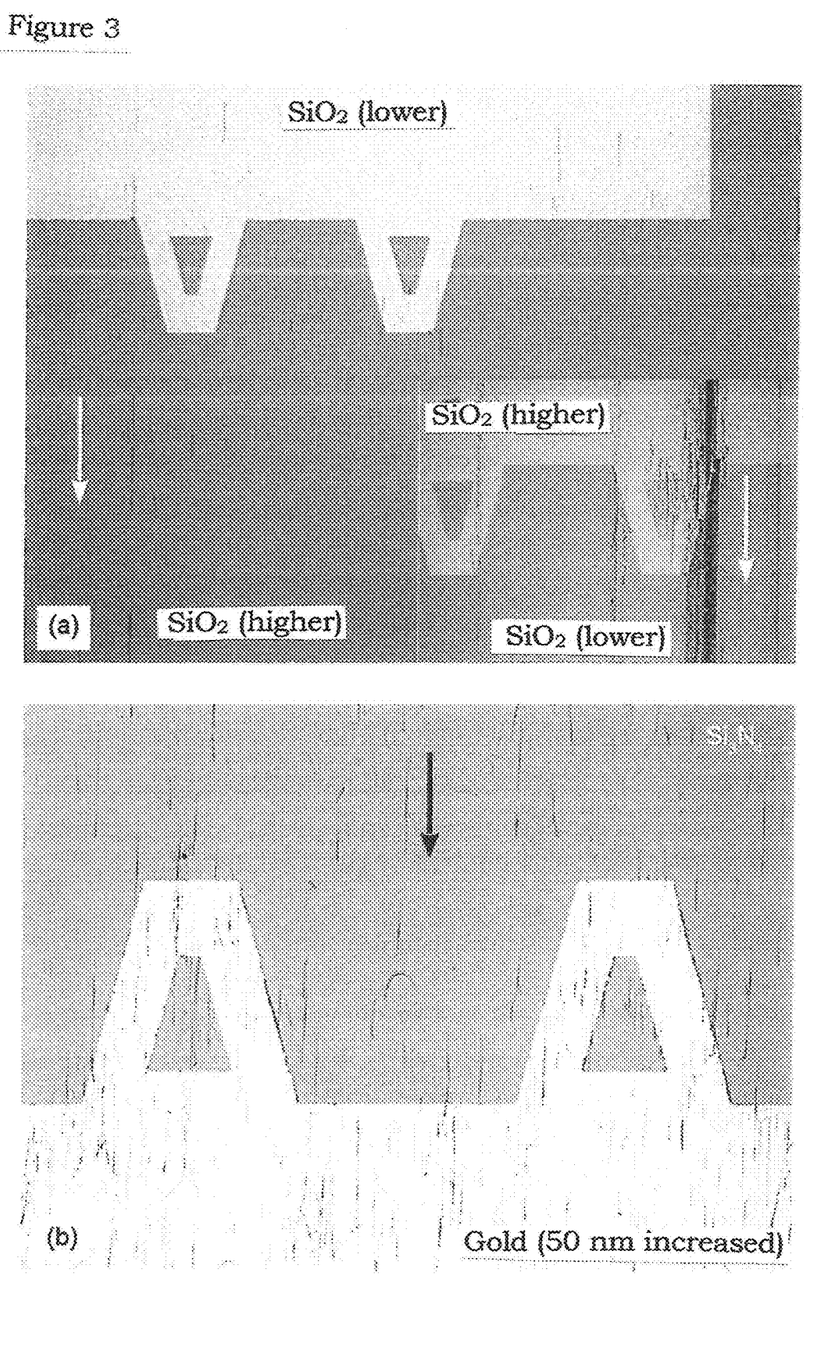

Since with SiO$_2$, despite an increase in the bearing weight of 60 g to 200 g with respect to 0.45 cm$^2$ as surface area, in general hardly any removal could be noted, a reduction in the effective surface area by step formation hardly leads to a significant increase in the deposition rate (see FIG. 3a). Here, typical surface damage for SiO$_2$ with 200 g bearing weight occurs in addition.

The case of a combination of the materials gold and Si$_3$N$_4$ with a step behaves differently. If a step made of gold is applied on Si$_3$N$_4$, then now a preferred deposition on the higher-lying gold is effected whilst lower-lying Si$_3$N$_4$ has only a very low nanowire density (see FIG. 3b).

A significant reduction in the surface area of raised surface structures is in principle accompanied by an increase in the local bearing force, which can lead to an increased nanowire density on raised portions. This effect is particularly pronounced for the system with silicon nanowires on the Si$_3$N$_4$ substrate used here.

Example 2—Height Difference and Different Material of the Regions

Additional degrees of freedom can be generated by the use of regions made of different materials (heterostructures such as e.g. Si$_3$N$_4$/SiO$_2$) and also by a reduction in the lateral structural size of the functional regions. Critical orders of magnitude of the structural geometries are thereby intrinsically the length and the diameter of the nanowires. In addition to the pure increase in the bearing force, also the dynamic interaction plays a large role, which appears in particular if the lateral dimension of the structure becomes smaller than the length of the nanowires. If a nanowire covers a raised structure only with part of the length thereof, then the nanowires are nevertheless effectively decoupled from the underlayer. A friction force at a critical level can hence hardly arise, only a mechanical deformation of the nanowires according to the model of a tensioned spring.

In general there applies that the smaller the lateral extension of the structure and the smaller the tribological activity of the step material, the more improbable is deposition of nanowires on the step. If the nanowire leaves a locally delimited increase by sliding off laterally or after complete covering, then the short vertical movement, induced by release of the deformation energy, seems to lead to a greater tribological interaction than with pure sliding friction. The critical friction value is exceeded and the nanowire is deposited behind or next to the raised portion with increased probability. This mechanism is extremely efficient and even results in a local/selective deposition on SiO$_2$. Nanowires can hereby be deposited in a significant quantity behind gold structures of different geometries on the approx. 50 nm lower-lying SiO$_2$, which is otherwise rather unsuitable for deposition.

Also for other underlayers, such as e.g. Si$_3$N$_4$, a greater deposition is produced behind the gold structures, however also a pronounced deposition in the lower area should be expected, as for the material Si$_3$N$_4$.

Figure 4:
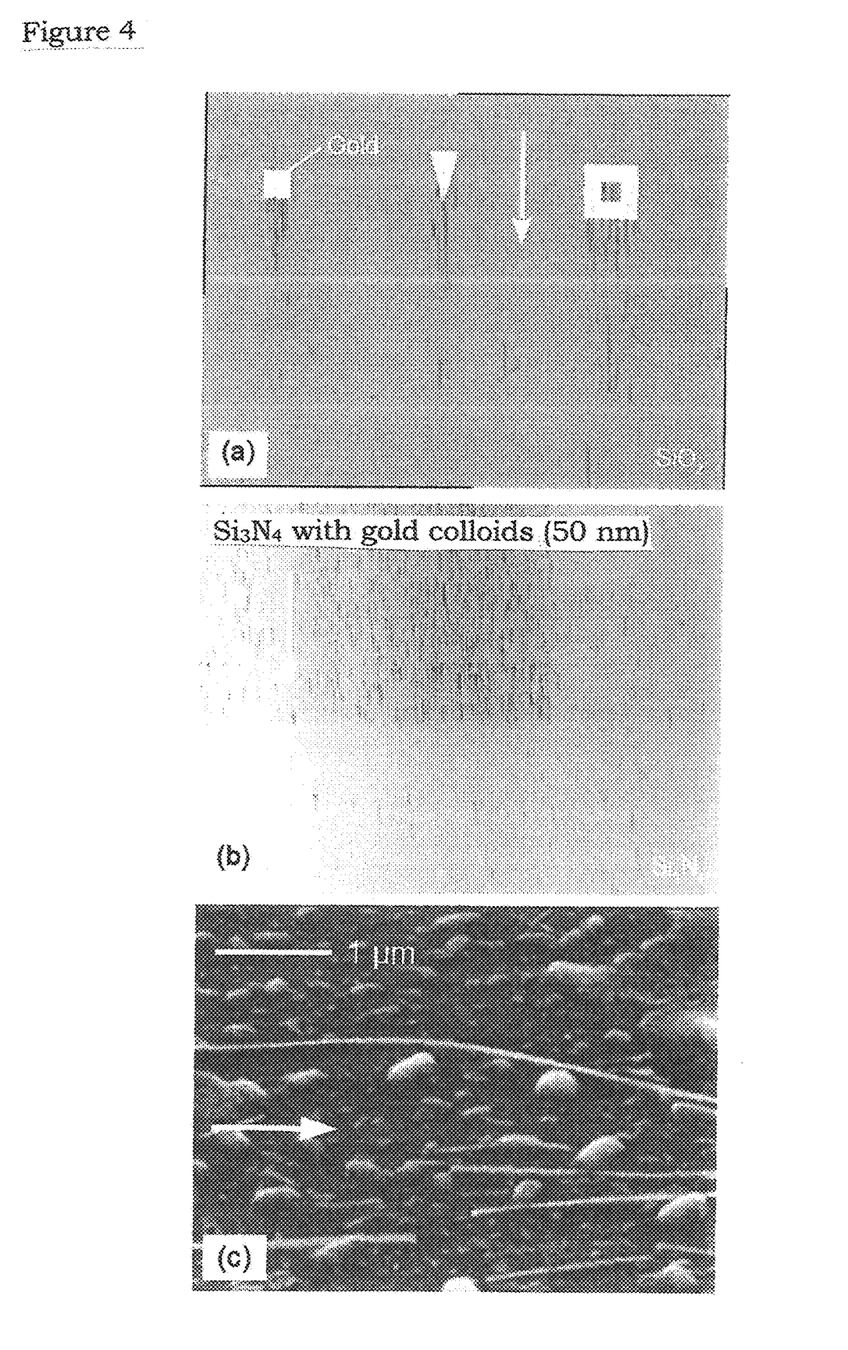
Figure 5:
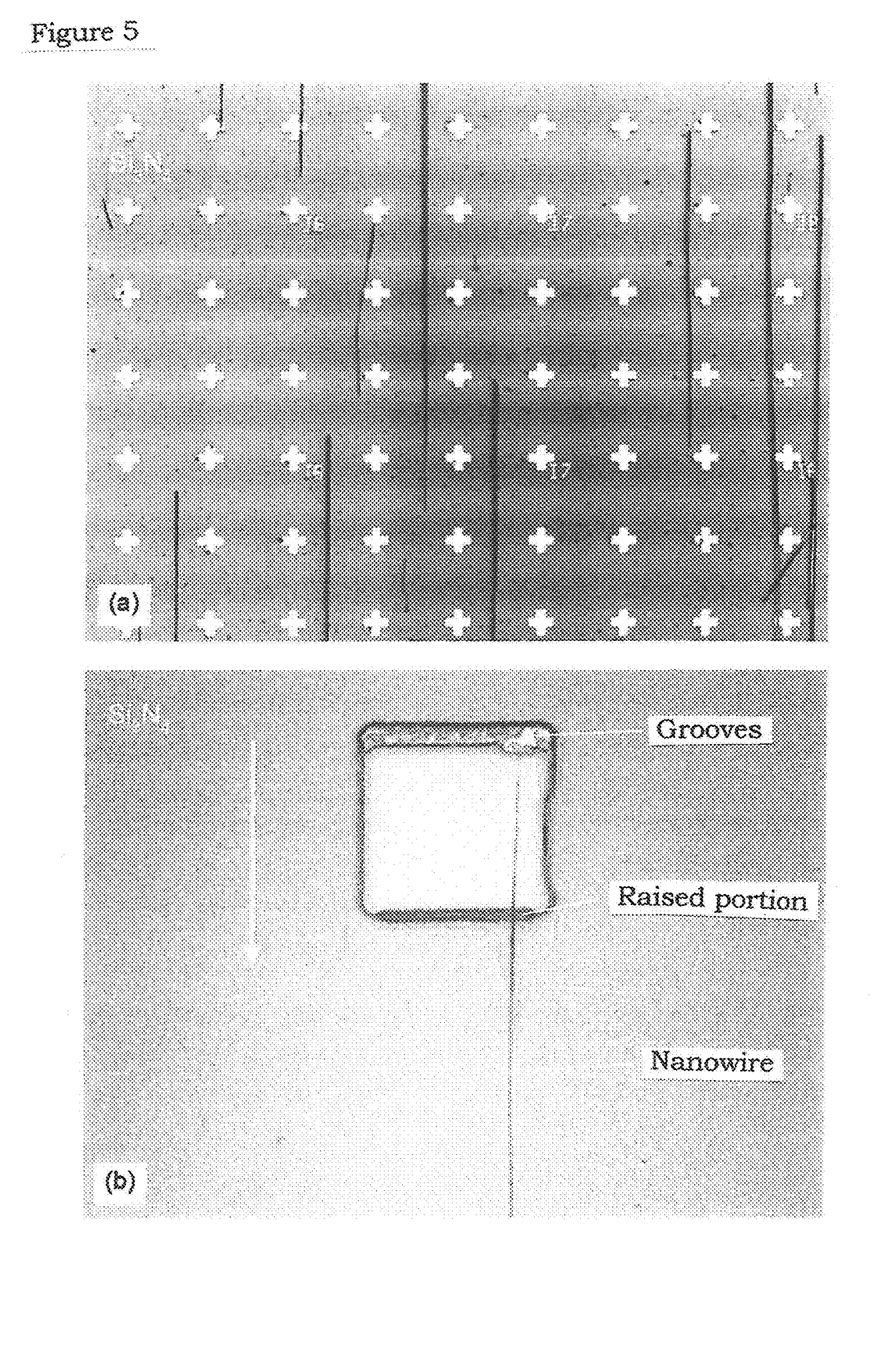

What is crucial for the general mechanism, in particular the height of the step, but not the lateral dimension thereof, is represented in FIGS. 4a and 4b. Gold nanoparticles with a diameter of approx. 50 nm were hereby applied in a local area on the surface of Si$_3$N$_4$. After the contact printing, the increasing effect of such a nanoparticle raised portion at a locally significantly increased density of nanowires becomes clear exactly in the area of the gold nanoparticles (FIG. 4b). By means of electron microscopy, it is shown that the nanowires are however not deposited on the gold or remain attached thereon but rather are deposited between the structures, also non-linearly (FIG. 4c). This effect is also observed in the case of microtechnologically produced structures, irrespective of the nanowire morphology (FIG. 5a).

In order to extend the general applicability of the principles presented here, regions made of SiO$_2$, including an SiO$_2$ step, were produced lithographically in an area with Si$_3$N$_4$. In contrast to the previous steps of 50 to 100 nm, these steps were however 400 nm to 500 nm high. As was to be expected, a change in the contact printing was observed in these regions. The nanowires hereby remain attached on the high step so that the nanowires were deposited preferably on the SiO$_2$ step (FIG. 5b).

Example 3—Height Difference Due to Special Step Shape

Furthermore, an influence on the lateral geometry itself also exists. The shape of the structure can hereby crucially influence the local probability of a nanowire deposition. This is shown particularly clearly in the case of triangular structures (see FIG. 4a).

Example 4—Groove Structure Between the Regions

It is possible with the method according to the invention to span groove structures in the substrate with nanowires. It was found that a groove can still be spanned when the latter is already equal in its width to half the length of the nanowires (e.g. nanowire length 40 µm, groove width 20 µm). It is hereby not absolutely necessary that both groove sides are orientated in a planar manner.

Example 5—Competition of Height Difference and Different Materials

A step defined previously in the substrate can be quasi overwritten by use of further functional structures, e.g. a raised step can be weakened and even neutralised in the tribological interaction thereof by adding a further step of greater height. The same applies for a lowered step. For example, a lowered step which, under specific conditions, effects no deposition of nanowires can, by applying nanoparticles with a large diameter, become a step on which nanowires are deposited. By means of this (temporary) modification of the step, the latter is quasi "overwritten" in the original effect thereof.

This fact can be used technically-procedurally, as a result of which additional degrees of freedom in the design of structures for surface-controlled contact printing are produced.

Example 6—Collector Structures on the Substrate

Collector structures permit specific and directed local deposition of a nanowire. The collector structures hereby represent for example microtechnologically-produced gold structures, between which, during the process for contact printing of nanowires, specific deposition of nanowires takes place (see e.g. FIG. 5a).

Also locally delimited regions of local roughness changes (here gold nanoparticles) and lateral geometries (e.g. triangular structures) can fall in the region of the collector structures. Collector structures consequently comprise all locally predefined structures which consist of a different material and/or have a different topography/geometry and hence lead to a local change in the tribological properties of the substrate and hence to a locally changed deposition probability of the nanowires.

Figure 6:
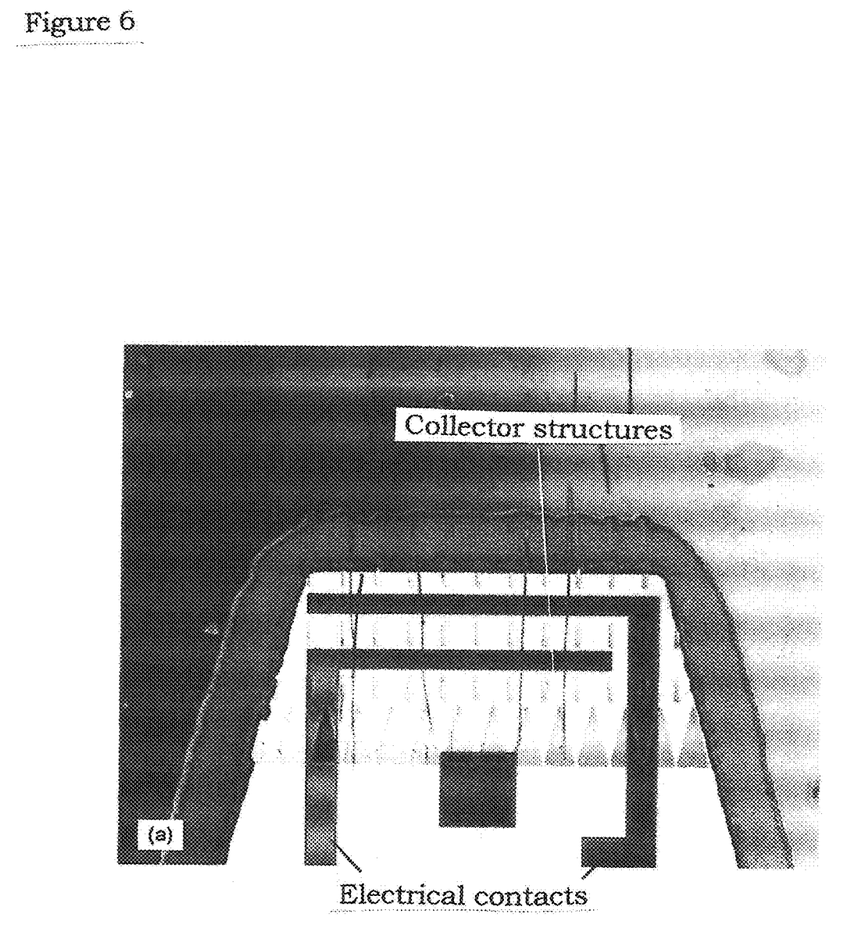
FIG. 6 shows a functional electrical structure with four integrated nanowires. The nanowires were deposited locally with the help of defined collector structures and subsequently integrated microtechnologically. On chips with 21 functional fields (7×3 matrix), a yield of up to 80% could be achieved in the manufacture of functional nanowire sensors for power microscopy.

As an application example, the provision of sensors for power microscopy with a nanowire in the region of the sensor tip is illustrated in FIG. 6. 3×7 sensors were hereby manufactured in parallel by conventional photolithography. For a functional sensor, it is necessary that a nanowire is deposited in a narrow, locally defined region in order that all structures can be contacted electrically subsequently in parallel without individual adaptation. For this special application, the requirement exists in addition that the nanowire extends beyond the structure. In tests, a yield of up to 80% was achieved with respect to the 21 sensors.

Figure 2:
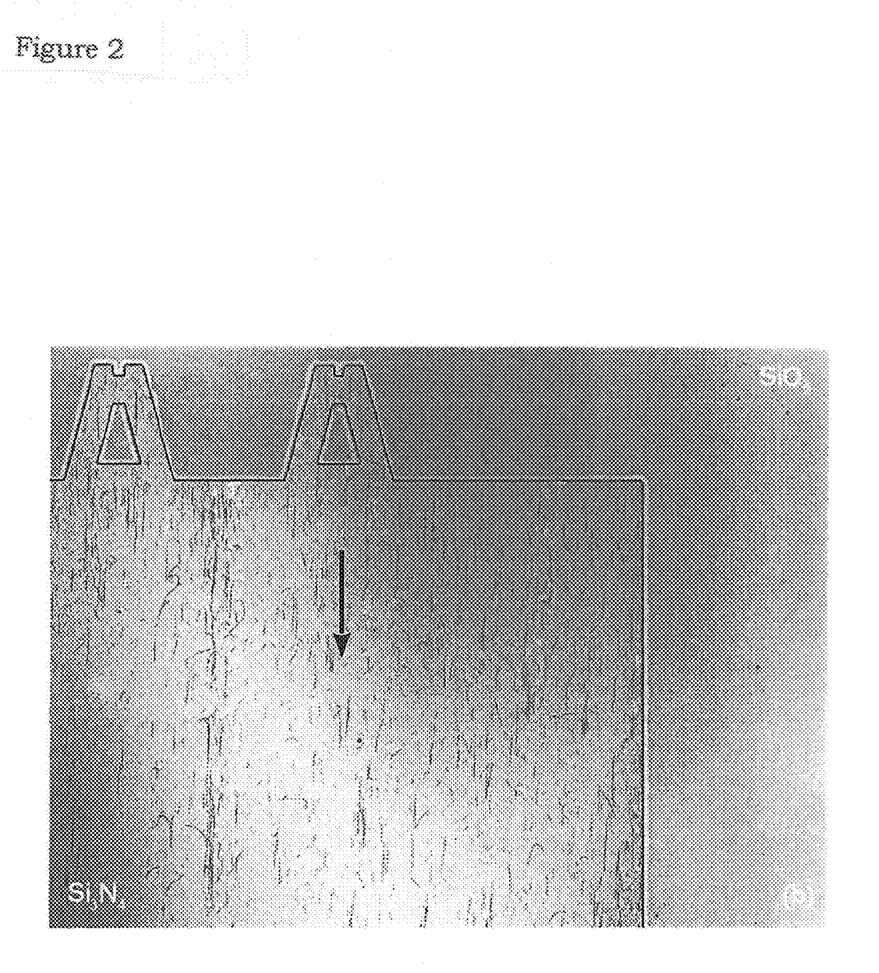
FIG. 2 shows a contact printing over an $SiO_2$—$Si_3N_4$ surface. A purely local deposition of nanowires on the $Si_3N_4$ is observed here with almost a yield of 100%.
Figure 7:
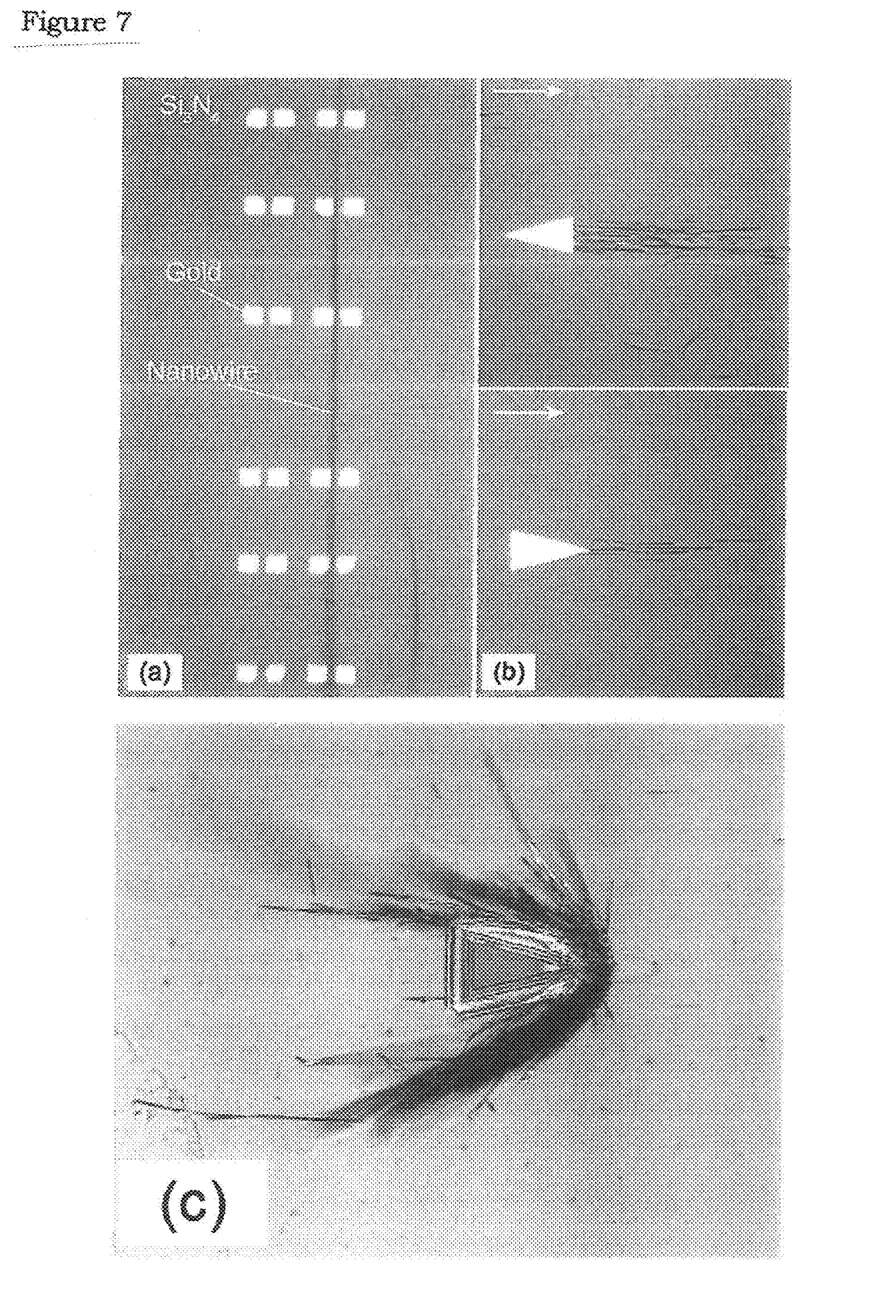
FIG. 7a) shows the basic principle of a collector structure with width filter, i.e. the deposition of nanowires in the intermediate spaces of the collector structures which are designed here as golden rectangles.
In FIG. 7b), the influence of the geometric shape of the second region—here a triangle with a height of approx. 50 nm—on the distribution of deposited nanowires is shown, it becoming clear that, with a direction of movement of the donor substrate from the base of the triangle to the tip thereof, nanowires are deposited above all on the tip.
In FIG. 7c), the random, non-specifically non-linear deposition of nanowires on a 1 μm high triangular resist structure is illustrated.

According to the design of the material system, a differentiation can be made between positive and negative collectors. In the case of a negative collector structure, the nanowire deposition is effected preferably on the underlayer between the structures (e.g. gold on $Si_3N_4$, FIG. 7a), the nanowire deposition, in contrast thereto, being effected on the structure in the case of a positive collector structure (e.g. $Si_3N_4$ on $SiO_2$, FIG. 2). Furthermore, there are also neutral structures, in which both properties can be observed (gold on $SiO_2$, FIG. 4a).

From the presentation of the model of a critical interaction length or surface area, it results consequently that the surface-controlled contact printing method includes the possibility of "filtering" of nanowires with respect to length and diameter (width) during contact printing. In order to be able to deposit nanowires of a specific predefined width or length, preferably locally, structures can be used as collectors vertically or laterally relative to the direction of movement, the spacing of the opposite structures determining the width or length which is to be deposited preferentially (see FIG. 7a).

Also steps of a different height, variations in the density of nanoparticles, the geometry of the collector structures etc. can be used for filtering of the length and the width. A further possibility is influencing the distribution of the deposited nanowires by the geometry of the collector structure shape (e.g. a raised triangle; see FIG. 7b)).

In addition to linear deposition, nanowires can also in principle be deposited in other forms. This is possible, on the one hand, by effective coupling of the tribological interaction with a variation in the stripping direction (e.g. x-y instead of only x component in the speed vector), but also by geometrical or tribological "guide rails" on the surface, i.e. positive and negative collector structures placed specifically on the substrate surface (see FIG. 7c)). Also in FIG. 4c), it can already be detected for the upper nanowire that the latter was deposited orientated non-linearly on the gold nanoparticles.

Example 7—Diamond as Substrate

Figure 8:
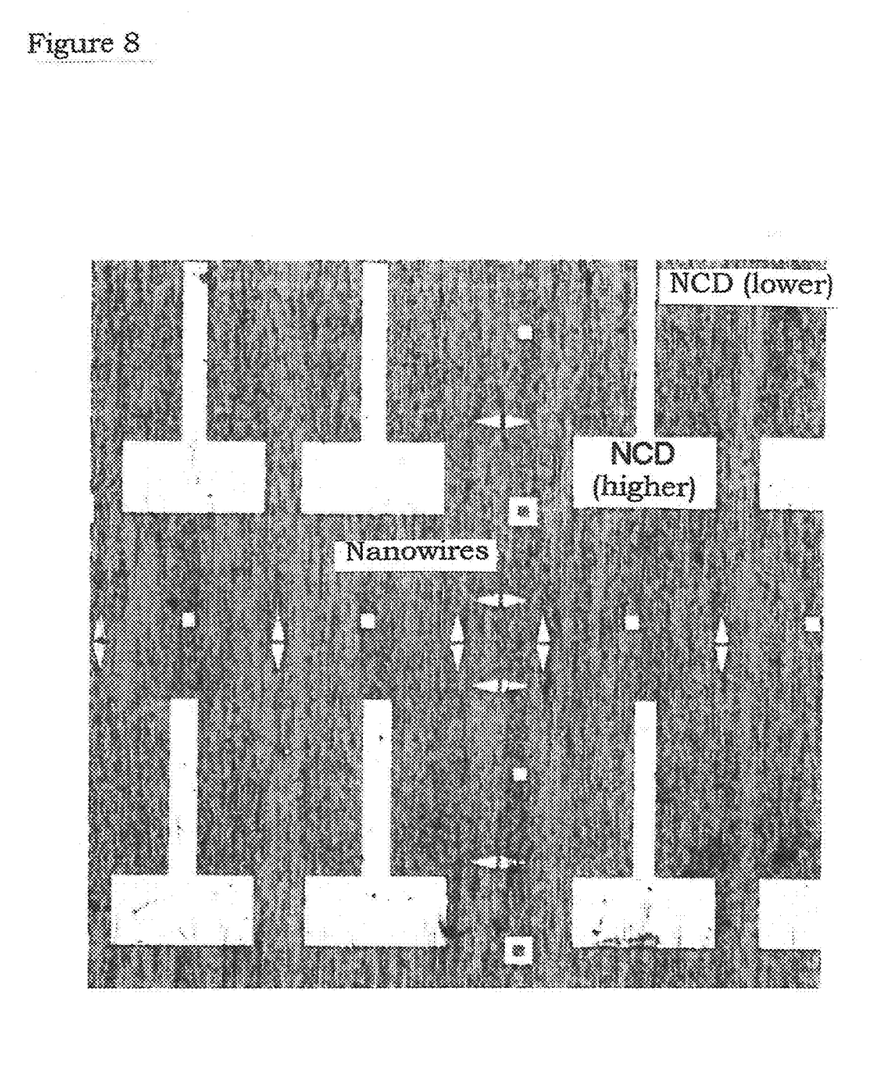

If a depression of 1 µm is etched into a nanocrystalline diamond layer (NCD) by means of oxygen plasma, then no deposition of the nanowires is effected on the raised portion (as with $Si_3N_4$) but on the lower-lying regions (i.e. the base of the recess). By means of the etching process, e.g. the tribological interaction of the etched surfaces can be significantly increased (e.g. roughness), which can again be exploited for local deposition (see FIG. 8).

The invention claimed is:

1. A method for the production of a substrate structured with nanowires, comprising the steps of:
   a) providing a substrate which, on one surface, comprises at least one first region with first tribological properties and at least one second region with second tribological properties, the first and second tribological properties being different and the first region contacting the second region at least in regions;
   b) pressing a donor substrate comprising nanowires with a specific contact pressure on the first region of the substrate so that the nanowires contact the first region of the substrate at least in regions; and
   c) moving the donor substrate relative to the substrate in the direction from the first region over at least the second region at a specific speed;
   wherein, no lubricant and no lithographical resist mask are utilized in the method and, merely by moving the donor substrate, in step c), and the different tribological properties of the two regions, a specific number of nanowires is deposited selectively at locally defined sites of the first and/or second region.

2. The method according to claim 1, wherein the different tribological properties are achieved via at least one collector structure which the first and/or second region comprises or consists of, or which is applied optionally thereon.

3. The method according to claim 2, wherein the at least one collector structure
   a) in the first region, comprises a material or consists thereof, which is identical to or different from a material of the second region;
   b) in the second region, comprises a material or consists thereof, which is identical to or different from a material of the first region;
   c) in the first region, comprises a topographical structure or consists thereof, which is identical to or different from the topographical structure of the second region; and/or
   d) in the second region, comprises a topographical structure or consists thereof, which is identical to or different from the topographical structure of the first region.

4. The method according to 2, wherein at least one collector structure comprises a metal, a metal compound, a semimetal, a semimetal compound, a plastic material and/or carbon, or consists thereof.

5. The method according to claim 3, wherein the topographical structure is selected from the group consisting of planar, linear, and point-type topographical structures.

6. The method according to claim 2, wherein the at least one collector structure has a length, width and/or height of 1 nm to 1 mm.

7. The method according to claim 2, wherein the at least one collector structure comprises nanoparticles or consists thereof.

8. The method according to claim 1, wherein the first and/or second region comprises at least two collector structures or consists thereof, or which are applied optionally thereon.

9. The method according to claim 1, wherein the nanowires are deposited on the substrate in a geometry which deviates from linearity.

10. The method according to claim 9, wherein the deposition in a geometry which deviates from linearity is achieved by
    i) movement of the donor substrate relative to the substrate in different directions relative to the first region and/or second region at a specific speed; and/or
    ii) movement of the donor substrate over at least one collector structure which the first and/or second region comprises or consists of, or which is applied optionally on the latter.

11. The method according to claim 1, wherein the first region and/or second region or between both regions, at least one groove is produced or disposed.

12. The method according to claim 1, wherein the nanowires
    i) comprise a metal, semimetal and/or carbon or consist thereof; and/or
    ii) are produced, before step b), via a vacuum process, or via a dry- or wet-chemical process; and/or
    iii) have a length of 100 nm to 1 mm; and/or
    iv) have a diameter of 1 nm to 5 µm; and/or
    v) have a conical, cylindrical, curved and/or square structure at least in regions; and/or
    vi) are metallically conducting, p-conducting, n-conducting, intrinsically conducting and/or non-conducting at least in regions or completely.

13. A substrate produced by the method of claim 1 comprising, on one surface,
    a) at least one first region with first tribological properties;
    b) at least one second region with second tribological properties, the second region contacting the first region at least in regions;
    c) at least one nanowire which contacts the first and/or second region at least in regions;
    wherein the first and second region have different tribological properties and the first and/or second region comprises a specific number of nanowires selectively at locally defined sites.

14. The method of claim 2, wherein the at least one collector structure comprises gold, Pt, Al, Si, Ge, $SiO_2$, $Si_3N_4$, diamond, $Al_2O_3$ and/or TiN, or consists thereof.

15. The method according to claim 2, wherein the at least one collector structure has a length, width and/or height of 2 nm to 500 µm.

16. The method according to claim 2, wherein the at least one collector structure has a length, width and/or height of 5 nm to 50 µm.

* * * * *